US009255972B2

(12) United States Patent
Hojo et al.

(10) Patent No.: US 9,255,972 B2
(45) Date of Patent: Feb. 9, 2016

(54) METHOD OF TESTING SECONDARY BATTERY

(75) Inventors: Katsuyuki Hojo, Toyota (JP); Hisanao Kojima, Kariya (JP); Hiroaki Ikeda, Toyota (JP); Hisataka Fujimaki, Nisshin (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 217 days.

(21) Appl. No.: 14/001,294

(22) PCT Filed: Mar. 2, 2011

(86) PCT No.: PCT/JP2011/001226
§ 371 (c)(1),
(2), (4) Date: Aug. 23, 2013

(87) PCT Pub. No.: WO2012/117448
PCT Pub. Date: Sep. 7, 2012

(65) Prior Publication Data
US 2013/0328566 A1    Dec. 12, 2013

(51) Int. Cl.
| G01N 27/416 | (2006.01) |
| G01R 31/36 | (2006.01) |
| H01M 10/44 | (2006.01) |
| H01M 10/04 | (2006.01) |
| H01M 10/30 | (2006.01) |
| H01M 10/48 | (2006.01) |

(52) U.S. Cl.
CPC ......... *G01R 31/3627* (2013.01); *H01M 10/446* (2013.01); *H01M 10/0431* (2013.01); *H01M 10/30* (2013.01); *H01M 10/48* (2013.01)

(58) Field of Classification Search
CPC ........... G01R 31/3648; G01R 31/3627; G01R 31/3662; G01R 31/3631; Y02E 60/12
USPC .......................................................... 324/426
See application file for complete search history.

(56) References Cited

U.S. PATENT DOCUMENTS

| 5,736,834 A * | 4/1998 | Kuno ............................. 320/146 |
| 5,808,442 A * | 9/1998 | Kaite et al. .................... 320/125 |
| 2006/0286438 A1 | 12/2006 | Fujikawa et al. |
| 2006/0286439 A1 | 12/2006 | Fujikawa et al. |
| 2008/0231237 A1* | 9/2008 | Kishi et al. ................... 320/160 |

FOREIGN PATENT DOCUMENTS

| JP | 2002-352864 | 12/2002 |
| JP | 2003-36887 | 2/2003 |
| JP | 2003-100351 | 4/2003 |
| JP | 2005-158643 | 6/2005 |

(Continued)

*Primary Examiner* — Arun Williams
(74) *Attorney, Agent, or Firm* — Finnegan, Henderson, Farabow, Garrett & Dunner, LLP

(57) ABSTRACT

A method of testing a secondary battery includes first to fourth steps. At the first step, the secondary battery after manufacture is charged to a first voltage. At the second step, a second voltage lower than the first voltage is set as a target voltage and discharge or charge is performed in a constant-current constant-voltage mode before the secondary battery is left standing. At the third step, the open circuit voltage of the secondary battery is measured before and after the secondary battery is left standing. At the fourth step, it is determined whether the secondary battery is a conforming item or not based on the difference in the open circuit voltage before and after the secondary battery is left standing.

15 Claims, 15 Drawing Sheets

(56) References Cited

FOREIGN PATENT DOCUMENTS

| JP | 2005-243537 | 9/2005 |
| JP | 2009-210494 | 9/2009 |
| JP | 2009-216681 | 9/2009 |
| WO | WO 2007/083405 A1 | 7/2007 |

* cited by examiner

METHOD OF TESTING SECONDARY BATTERY

CROSS-REFERENCE TO RELATED APPLICATIONS

This application is a national phase application of International Application No. PCT/JP2011/001226, filed Mar. 2, 2011, the content of which is incorporated herein by reference.

TECHNICAL FIELD

The present invention relates to a method of testing a manufactured secondary battery.

BACKGROUND ART

After a secondary battery is manufactured, a test is conducted to check whether or not foreign matter is mixed in the secondary battery. If any foreign matter is mixed, a short circuit may occur within the secondary battery.

A test method includes charging the secondary battery to a full charge state and then leaving the secondary battery standing. The voltage of the secondary battery is measured before and after it is left standing, and it can be determined on the basis of the difference between those voltages (voltage drop) whether or not foreign matter is mixed in the secondary battery. The voltage drop when the short circuit occurs due to the foreign matter is larger than the voltage drop in the secondary battery which includes no foreign matter.

PRIOR ART DOCUMENTS

Patent Documents

[Patent Document 1] Japanese Patent Laid-Open No. 2003-036887
[Patent Document 2] Japanese Patent Laid-Open No. 2009-216681
[Patent Document 3] Japanese Patent Laid-Open No. 2009-210494
[Patent Document 4] International Publication No. WO 07/083405
[Patent Document 5] Japanese Patent Laid-Open No. 2005-158643
[Patent Document 6] Japanese Patent Laid-Open No. 2005-243537

DISCLOSURE OF THE INVENTION

Problems to be Solved by the Invention

After the secondary battery is charged, the concentration of ions is not uniform on the surface of an electrode, and the electrode potential changes until the nonuniformity of the ion concentration is suppressed. Thus, the voltage of the secondary battery is reduced due to the characteristics of the secondary battery regardless of whether or not any foreign matter is mixed. To determine the mixture of foreign matter, it is necessary to wait until the change in the electrode potential ceases and then to check whether or not any voltage drop is found. Such a determination method may take a long time to complete the determination of the mixture of foreign matter.

Means for Solving the Problems

The present invention provides a method of testing a secondary battery including first to fourth steps. At the first step, the secondary battery after manufacture is charged to a first voltage. At the second step, discharge or charge is performed in a constant-current constant-voltage mode with a second voltage set as a target voltage before the secondary battery is left standing, the second voltage being lower than the first voltage. At the third step, the open circuit voltage of the secondary battery is measured before and after the secondary battery is left standing. At the fourth step, it is determined whether the secondary battery is a conforming item or not based on the difference in the open circuit voltage before and after the secondary battery is left standing.

According to a first aspect of the present invention, the charge is performed in a constant-current mode at the first step.

According to a second aspect of the present invention, a heating step of heating the secondary battery is performed by using heat generated in a heat source. The heating of the secondary battery can promote the diffusion of the ions to reduce the nonuniformity of the ion concentration on the electrode. The heating step can be performed before the secondary battery is left standing.

According to the first and second aspects of the present invention, at the second step, the discharge can be performed in the constant-current constant-voltage mode on the secondary battery being charged. In addition, the charge can be performed in the constant-current constant-voltage mode on the secondary battery being discharged. At the fourth step, the secondary battery can be determined as a nonconforming item when the difference in the open circuit voltage is larger than a threshold value, and the secondary battery can be determined as a conforming item when the difference in the open circuit voltage is smaller than the threshold value. The first voltage can be set at the upper limit voltage of the secondary battery. According to the second aspect of the present invention, the charge can be performed in the constant-current constant-voltage mode at the first step. The charge performed in the constant-current constant-voltage mode can uniformize the concentration of ions in a portion of an electrode.

Advantage of the Invention

According to the present invention, after manufactured secondary battery is charged to the first voltage, the charge or discharge is performed in the constant-current constant-voltage mode to cause the voltage of the secondary battery to reach the second voltage lower than the first voltage. This can reduce the nonuniformity of the ion concentration on the electrode of the secondary battery to shorten the time taken for the open circuit voltage to change due to the ion diffusion. Once the time taken for the open circuit voltage to change due to the ion diffusion can be shortened, any change in the open circuit voltage resulting from a short circuit of the secondary battery due to the mixture of foreign matter, if any, is easily detected. Therefore, the determination of whether the secondary battery is a conforming item or not can be performed efficiently and quickly.

MODE FOR CARRYING OUT THE INVENTION

Embodiments of the present invention will hereinafter be described.

Embodiment 1

Figure 1:
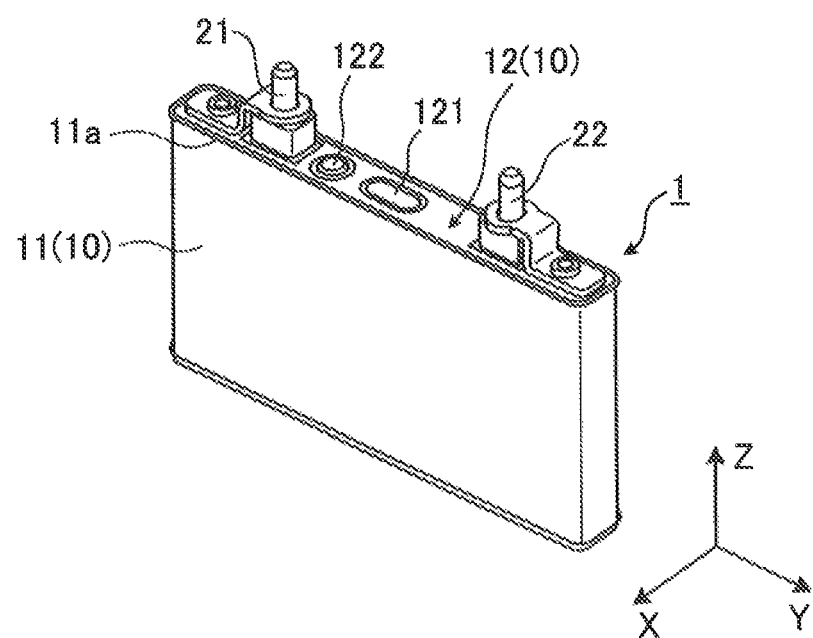
FIG. 1 is an external view of a secondary battery.
Figure 2:
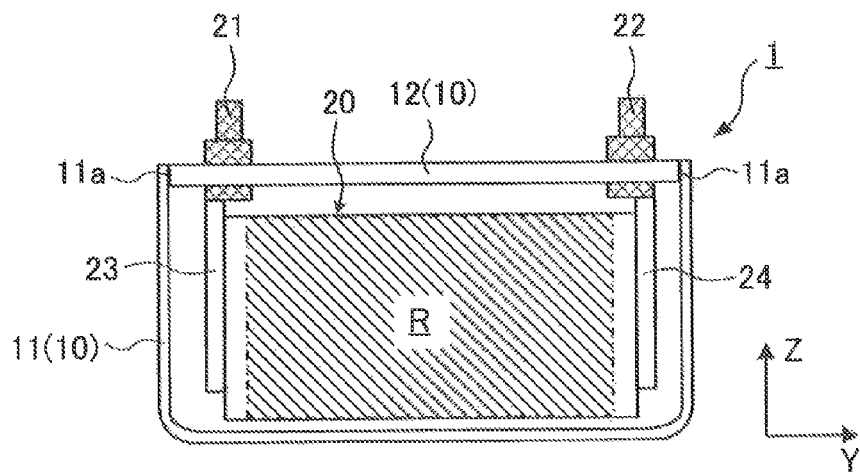
FIG. 2 is a diagram showing the internal structure of the secondary battery.

Description is made of the structure of a secondary battery which is Embodiment 1. FIG. 1 is an external view of the secondary battery which is Embodiment 1, and FIG. 2 is a diagram showing the internal structure of the secondary battery. In FIG. 1 and FIG. 2, an X axis, a Y axis, and a Z axis are axes orthogonal to each other. The relationship among the X axis, the Y axis, and the Z axis applies to the other figures.

Examples of the secondary battery 1 include a nickel metal hydride battery and a lithium-ion battery. The secondary battery 1 can be used as the power source for running of a vehicle.

Specifically, a plurality of secondary batteries 1 can be connected electrically in series to constitute an assembled battery, and the assembled battery can be mounted on the vehicle. An electric energy output from the assembled battery can be converted by a motor generator into a kinetic energy which can be used to run the vehicle. A kinetic energy generated in braking of the vehicle can be converted by the motor generator into an electric energy which can be stored in the assembled battery.

The secondary battery 1 has a battery case 10 and a power-generating element 20 housed in the battery case 10. The battery case 10 has a case body 11 and a lid 12, each of which can be made of metal. The case body 11 has an opening portion 11a used for incorporating the power-generating element 20 thereinto. The lid 12 closes the opening portion 11a of the case body 11, and the battery case 10 is in a sealed state. The lid 12 and the case body 11 can be fixed to each other by welding, for example.

A positive electrode terminal 21 and a negative electrode terminal 22 insulated from each other are fixed to the lid 12. The positive electrode terminal 21 passes through the lid 12 and is connected electrically to the power-generating element 20 through a positive electrode tab 23. The positive electrode tab 23 can be connected to the positive electrode terminal 21 and the power-generating element 20 by welding, for example. The negative electrode terminal 22 passes through the lid 12 and is connected electrically to the power-generating element 20 through a negative electrode tab 24. The negative electrode tab 24 can be connected to the negative electrode terminal 22 and the power-generating element 20 by welding, for example.

The lid 12 has a valve 121 which is used to release gas produced within the battery case 10 to the outside of the battery case 10. The valve 121 is of a so-called break type. When the internal pressure of the battery case 10 reaches the operating pressure of the valve 121 resulting from the production of the gas, the valve 121 irreversibly switches from a closed state to an opened state.

Although the break-type valve 121 is used in the present embodiment, a valve of a so-called recovery type may be used. The recovery-type valve refers to a valve which reversibly switches between a closed state and an opened state. When the internal pressure of the battery case 10 reaches the operating pressure of the valve, the valve switches from the closed state to the opened state. On the other hand, when the internal pressure of the battery case 10 falls below the operating pressure of the valve, the valve switches from the opened state to the closed state.

The lid 12 has a cap 122 which is used to close an injection portion formed in the lid 12. The injection portion is used to inject an electrolytic solution into the battery case 10. After the injection of the electrolytic solution into the battery case 10, the injection portion is closed by the cap 122.

Figure 3:
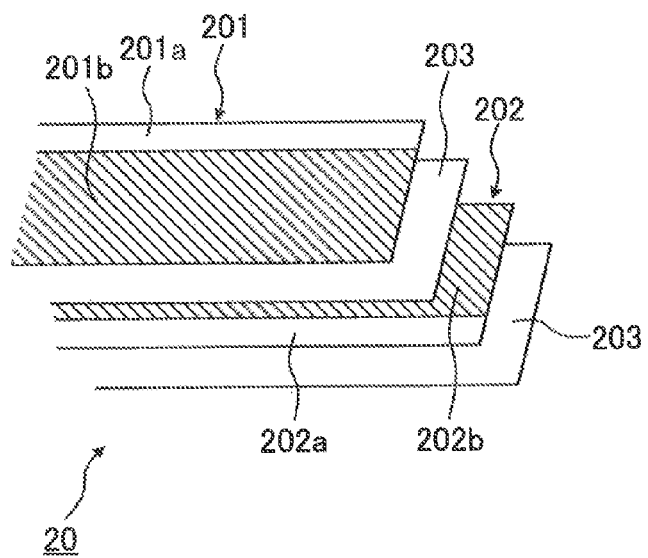
FIG. 3 is a developed view of a power-generating element.

Next, the configuration of the power-generating element 20 is described. FIG. 3 is a developed view of part of the power-generating element 20.

As shown in FIG. 3, the power-generating element 20 has a positive electrode plate 201, a negative electrode plate 202, and a separator 203. The separator 203 contains the electrolytic solution.

The positive electrode plate 201 has a collector plate 201a and a positive electrode active material layer 201b formed on the surface of the collector plate 201a. The positive electrode active material layer 201b includes a positive electrode active material, a conductive agent, a binder and the like. The positive electrode active material layer 201b is formed on a region of the collector plate 201a, and the remaining region of the collector plate 201a is exposed.

When the secondary battery 1 is the lithium-ion secondary battery, the positive electrode active material can be provided by using a positive electrode active material predominantly made of lithium-cobalt composite oxide (for example, $LiCoO_2$), lithium-nickel composite oxide (for example, $LiNiO_2$), and lithium-manganese composite oxide ($LiMn_2O_4$). A composite oxide containing two or more transition metal elements can be used. For example, LiNiCoMnO2 can be used as the composite oxide. For the conductive agent, carbon powder such as carbon black or conductive metal powder such as nickel powder can be used. For the binder, a polymer soluble in an organic solvent can be used when a non-aqueous solvent is used, for example.

The negative electrode plate 202 has a collector plate 202a and a negative electrode active material layer 202b formed on the surface of the collector plate 202a. The negative electrode active material layer 202b includes a negative electrode active material, a binder and the like. The negative electrode active material layer 202b is formed on a region of the collector plate 202a, and the remaining region of the collector plate 202a is exposed.

When the secondary battery 1 is the lithium-ion secondary battery, carbon can be used as the negative electrode active material, for example. For the binder, a polymer soluble in an organic solvent can be used when a non-aqueous solvent is used, for example.

The positive electrode plate 201, the negative electrode plate 202, and the separator 203 are stacked in the order shown in FIG. 3, and the stack is wound to provide the power-generating element 20. The stack is wound around an axis extending in the Y direction in FIG. 2. In FIG. 2, at one end of the power-generating element 20 in the Y direction, only the collector plate 201a of the positive electrode plate 201 is wound. The positive electrode tab 23 is connected to that collector plate 201a. At the other end of the power-generating element 20 in the Y direction, only the collector plate 202a of the negative electrode plate 202 is wound. The negative electrode tab 24 is connected to that collector plate 202a.

A region R shown in FIG. 2 is the region where the positive electrode active material layer 201b of the positive electrode plate 201 and the negative electrode active material layer 202b of the negative electrode plate 202 are placed one on the other, and corresponds to the region used for charge and discharge of the secondary battery 1. In charging the lithium-ion secondary battery serving as the secondary battery 1, the positive electrode active material layer 201b releases lithium ions into the electrolytic solution, and the negative electrode active material layer 202b stores the lithium ions present in the electrolytic solution. In discharging the lithium-ion secondary battery, the positive electrode active material layer 201b stores the lithium ions present in the electrolytic solution, and the negative electrode active material layer 202b releases the lithium ions into the electrolytic solution.

Although the stack formed of the positive electrode plate 201, the negative electrode plate 202, and the separator 203 is wound to provide the power-generating element 20 in the present embodiment, the present invention is not limited thereto. For example, the power-generating element 20 can be configured only by stacking the positive electrode plate 201, the negative electrode plate 202, and an electrolyte layer. Although the electrolytic solution is used in the present embodiment, a solid electrolyte may be used.

Although the battery case 10 is formed in a rectangular shape in the present embodiment, the present invention is not limited thereto. For example, a battery case formed in a cylindrical shape can be used. In addition, the secondary battery configured by covering the power-generating element 20 with a laminated film can be used.

Figure 4:
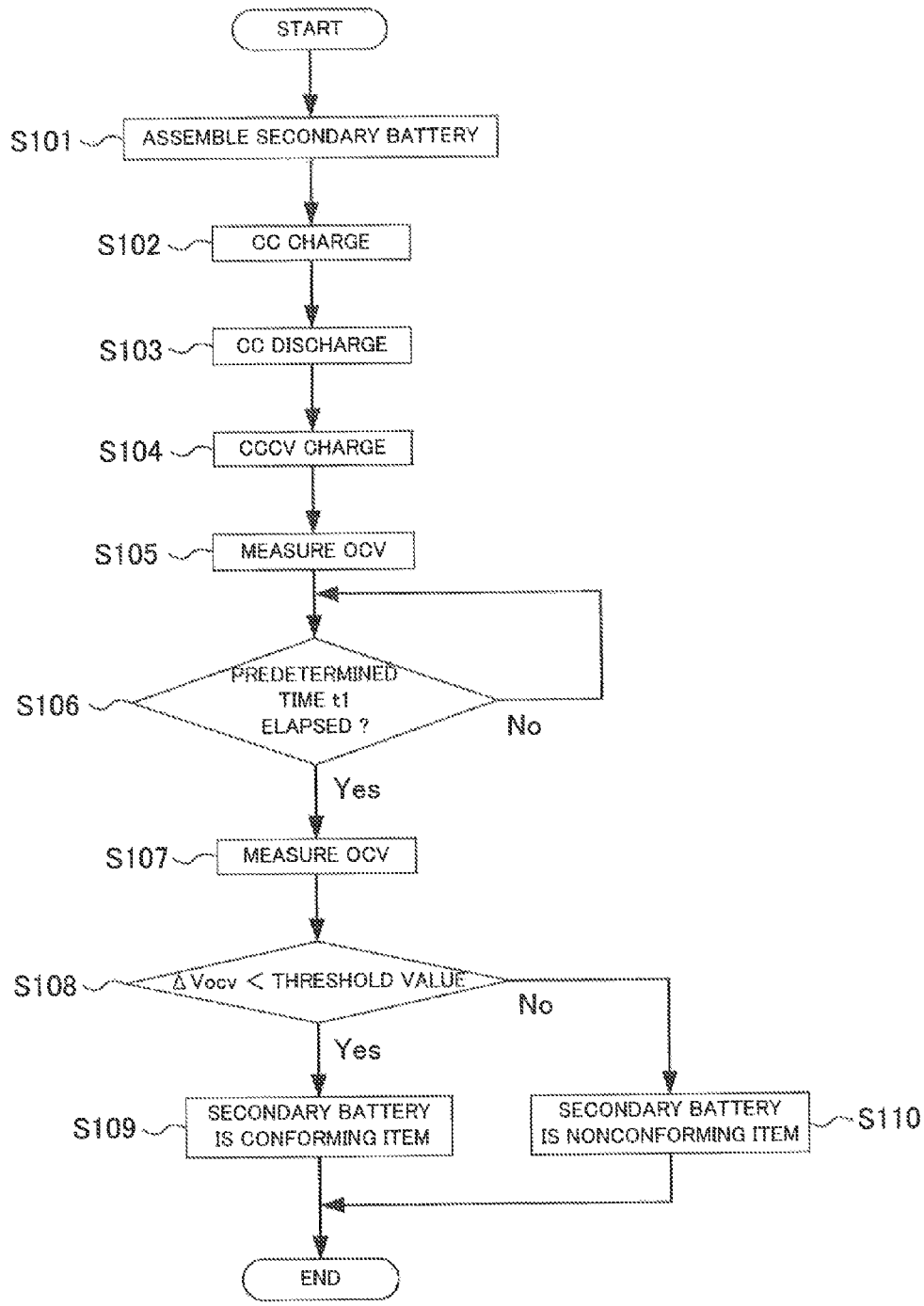
FIG. 4 is a flow chart showing a process of testing the secondary battery in Embodiment 1.

Next, description is made of the process of testing the secondary battery 1 with reference to FIG. 4.

At step S101, the secondary battery 1 is assembled. Specifically, the positive electrode terminal 21 and the negative electrode terminal 22 are fixed to the lid 12, the power-generating element 20 is previously manufactured, and the positive electrode tab 23 is fixed to the power-generating element 20 and the positive electrode terminal 21, and similarly, the negative electrode tab 24 is fixed to the power-generating element 20 and the negative electrode terminal 22. As a result, the positive electrode terminal 21, the negative electrode terminal 22, and the power-generating element 20 can be fixed to the lid 12.

Next, the power-generating element 20 is put into the case body 11, and the lid 12 closes the opening portion 11a of the case body 11. The lid 12 and the case body 11 are fixed to each other by welding, for example. The electrolytic solution is injected into the battery case 10 through the injection portion formed in the lid 12. Once the electrolytic solution is injected, the electrolytic solution can be infiltrated into the power-generating element 20. Specifically, the electrolytic solution is infiltrated into the separator 203, between the separator 203 and the positive electrode plate 201, and between the separator 203 and the negative electrode plate 202.

After the injection of the electrolytic solution, the injection portion can be closed by the cap 122 to set the battery case 10 in the sealed state. The assembly of the secondary battery 1 is completed in this manner. When the solid electrolyte is used as the electrolyte in the power-generating element 20, the processing of injecting the electrolytic solution is omitted.

Figure 5:
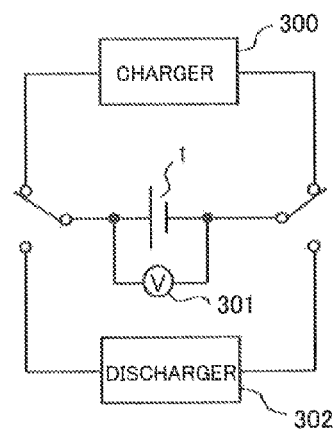
FIG. 5 is a schematic diagram of an apparatus for testing the secondary battery.
Figure 6:
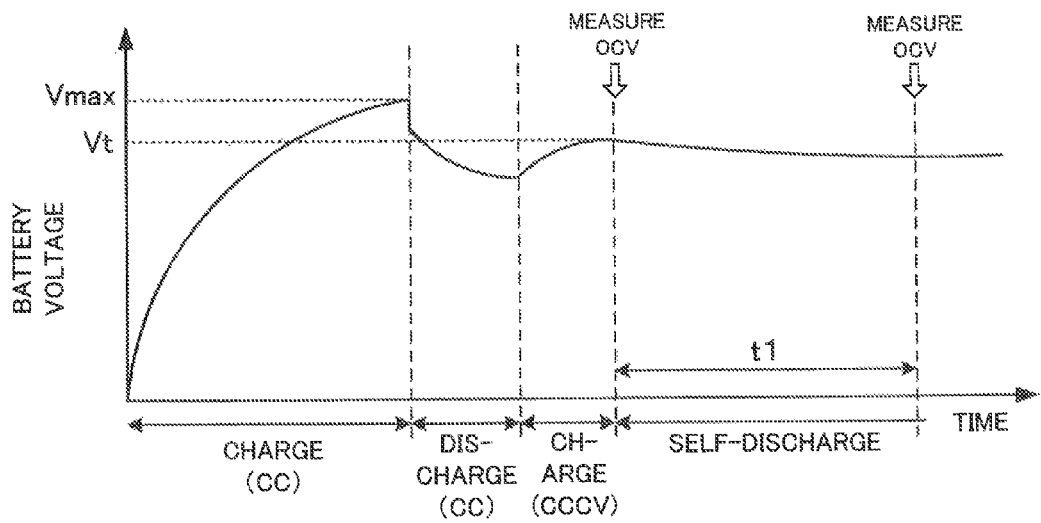
FIG. 6 is a graph showing changes in voltage of the secondary battery during the test in Embodiment 1.

At step S102, as shown in FIG. 5, a charger 300 is connected to the secondary battery 1 to charge the secondary battery 1 in a constant current mode (CC mode). The CC mode is a mode in which charge or discharge of the secondary battery 1 is performed at a constant current. The charge in the CC mode increases the voltage of the secondary battery 1 as shown in FIG. 6. FIG. 6 is a graph showing changes in voltage of the secondary battery 1 during the process of testing the secondary battery 1. The vertical axis in FIG. 6 represents the voltage (CCV; Closed Circuit Voltage) of the secondary battery 1, and the horizontal axis in FIG. 6 represents time.

When the voltage of the secondary battery 1 reaches an upper limit voltage Vmax, the charge in the CC mode is stopped. By connecting a voltage sensor 301 to the secondary battery 1 as shown in FIG. 5, the voltage of the secondary battery 1 can be monitored on the basis of the output from the voltage sensor 301. The upper limit voltage Vmax is the upper limit value of the use voltage range of the secondary battery 1. Although the secondary battery 1 is charged to the upper limit voltage Vmax in the present embodiment, the secondary battery 1 may be charged only to a voltage value lower than the upper limit voltage Vmax.

Figure 7:
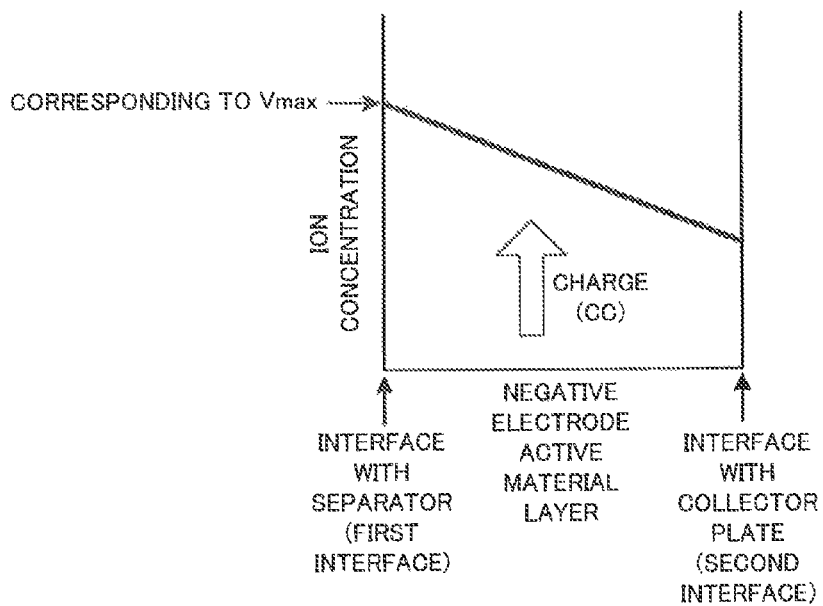
FIG. 7 is a diagram showing the distribution of ion concentration in a negative electrode active material layer after charge in a CC mode is performed in Embodiment 1.

FIG. 7 is a schematic diagram showing the state of ions in the negative electrode plate 202 after the charge in the CC mode is performed. In FIG. 7, the vertical axis represents the ion concentration and the horizontal axis represents the position in the thickness direction of the negative electrode active material layer 202b. One end of the horizontal axis indicates the interface (referred to as a first interface) between the negative electrode active material layer 202b and the separator 203 (electrolytic solution), and the other end of the horizontal axis indicates the interface (referred to as a second interface) between the negative electrode active material layer 202b and the collector plate 202a.

Immediately after the secondary battery 1 is charged, the ions (for example, lithium ions in the lithium-ion secondary battery) do not diffuse sufficiently within the negative electrode active material layer 202b and are distributed unevenly. The ion concentration is the highest at the first interface and is reduced toward the second interface. The ion concentration at the first interface corresponds to the upper limit voltage Vmax.

At step S103, the secondary battery 1 is discharged in the constant current mode (CC mode). Specifically, the secondary battery 1 is connected to a discharger 302 to perform the discharge in the CC mode in FIG. 5. The discharge of the secondary battery 1 reduces the voltage of the secondary battery 1 as shown in FIG. 6. The discharge in the CC mode is performed for a predetermined time. The predetermined time can be preset.

Figure 8:
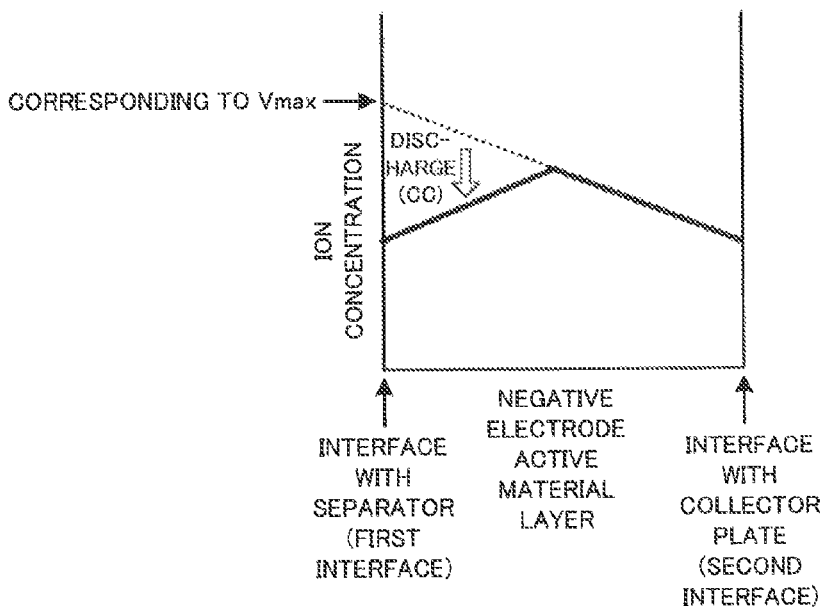
FIG. 8 is a diagram showing the distribution of ion concentration in the negative electrode active material layer after discharge in the CC mode is performed in Embodiment 1.

When the discharge in the CC mode is performed, the ion concentration at the first interface starts to reduce as shown in FIG. 8. In the discharge of the secondary battery 1, the ion concentration tends to reduce in a region closer to the first interface which is farther from the second interface. As a result, in the ion concentration distribution within the negative electrode active material layer 202b, the highest ion concentration is found at a portion between the first interface and the second interface.

At step S104, the secondary battery 1 is charged in a constant-current constant-voltage mode (CCCV mode). During the charge in the CCCD mode, charge is first performed at a constant current, and when the voltage of the secondary battery 1 reaches a target voltage Vt, charge is performed at a constant voltage. The charge in the CCCV mode allows the voltage of the secondary battery 1 to reach the target voltage Vt and to be maintained at the target voltage Vt. The target voltage Vt has a value lower than the upper limit voltage Vmax. The target voltage Vt can be previously set to determine the discharge time in the CC mode at step S103.

Description is made of a method (by way of example) of determining the target voltage Vt.

The secondary battery 1 is represented by an equivalent circuit (CR equivalent circuit) using a capacitor and a resistor. Specifically, the secondary battery 1 can be represented by the capacitor with a capacitance C and an insulation resistance and a short-circuit resistance which are connected in parallel to the capacitor. The insulation resistance refers to a voltage drop due to ion diffusion represented as a resistance. The short-circuit resistance refers to a value determined by a short circuit due to foreign matter. The capacitance C has a value calculated by dividing an electric current passing through the secondary battery 1 by a voltage change (dV/dt).

In the CR equivalent circuit, the voltage change observed in discharge at a constant resistance is reduced as the capacitance C is increased. In other words, as the capacitance C is increased, the voltage change amount due to the short-circuit resistance is reduced. For this reason, when the target voltage Vt is determined under the condition that the capacitance C is low, the voltage change amount due to the short-circuit resistance is easily detected to facilitate the determination of whether or not foreign matter is mixed.

Figure 9:
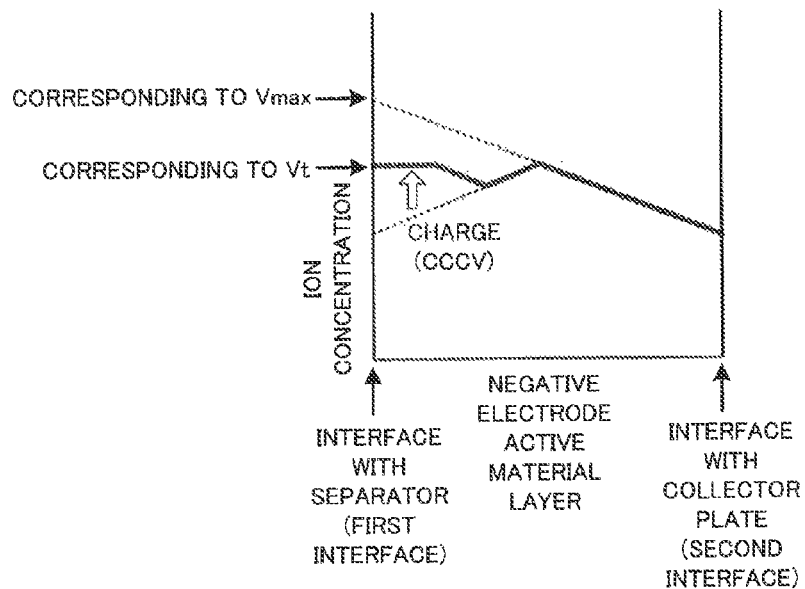
FIG. 9 is a diagram showing the distribution of ion concentration in the negative electrode active material layer after charge in a CCCV mode is performed in Embodiment 1.

When the charge in the CCCV mode is performed, the ion concentration at the first interface increases as shown in FIG. 9. The ion concentration at the first interface corresponds to the target voltage Vt. Since the charge is performed at the constant voltage, the ion concentration is uniformized in a region including the first interface.

At step S105, immediately after the charge in the CCCV mode is completed, the OCV (Open Circuit Voltage) of the secondary battery 1 is measured.

At step S106, the secondary battery 1 is left standing in the air, and it is determined whether or not a predetermined time t1 has elapsed. At step S106, the secondary battery 1 is left standing in the environment in which the secondary batter 1 is not actively heated. The predetermined time t1 refers to the time required to determine a voltage drop due to a short circuit of the secondary battery 1 caused by foreign matter, and can be predefined.

After the predetermined time t1 has elapsed, the OCV of the secondary battery 1 is measured at step S107. At step S108, the difference $\Delta Vocv$ between the OCV measured at step S105 and the OCV measured at step S107 is calculated. It is determined whether or not the voltage difference $\Delta Vocv$ is smaller than a threshold value. The threshold value is the value for determining a short circuit due to foreign matter, and can be predefined.

When the voltage difference $\Delta Vocv$ is smaller than the threshold value, it is determined at step S109 that a short circuit (voltage drop) due to foreign matter does not occur, and it can be determined that no foreign matter is mixed in the secondary battery 1. In this case, the secondary battery 1 is determined as a conforming item.

On the other hand, when the voltage difference $\Delta Vocv$ is larger than the threshold value, it is determined at step S110 that a short circuit (voltage drop) due to foreign matter occurs, and it can be determined that foreign matter is mixed in the secondary battery. In this case, the secondary battery 1 is determined as a nonconforming item.

The processing operations at step S109 and S110 can be performed automatically. Specifically, the data about the OCV obtained at step S105 and S107 is output to a controller, and the controller can calculate the difference between the two OCVs and compare the voltage difference $\Delta Vocv$ with the threshold value. Thus, the controller can distinguish the conforming item from the nonconforming item. The information about the conforming item and the nonconforming item can be output as voice or displayed on a display to allow an operator to check whether the secondary battery 1 is a conforming item or a nonconforming item.

According to the present embodiment, the charge in the CC mode, the discharge in the CC mode, and the charge in the CCCV mode can be performed to uniformize the ion concentration within the negative electrode active material layer 202b. After the charge in the CCCV mode is performed, the ion concentration distribution in the negative electrode active material layer 202b has the state shown in FIG. 10. In the state shown in FIG. 10, the ion concentration can be uniformized only by diffusing the ions in areas A1 and A2.

Figure 10:
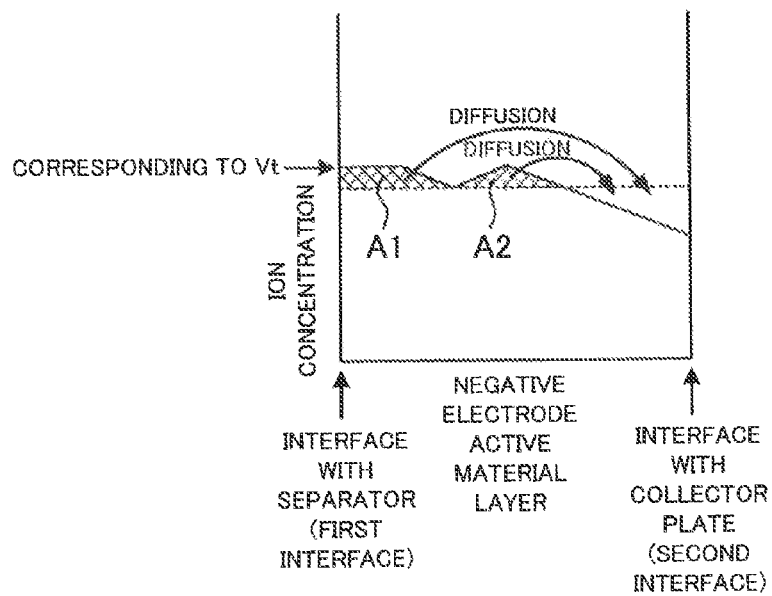
FIG. 10 is a diagram for explaining ion diffusion when the secondary battery is left standing in Embodiment 1.

In the state shown in FIG. 10, the nonuniformity of the ion concentration is reduced as compared with the state shown in FIG. 7. Thus, in the state shown in FIG. 10, the amount of ions to be diffused can be reduced to shorten the time taken to uniformize the ion concentration as compared with the state shown in FIG. 7. The shortening of the time taken to uniformize the ion concentration can reduce the time taken by the voltage drop resulting from the ion diffusion. By uniformizing the ion concentration at an early stage, the voltage drop resulting from the short circuit of the secondary battery 1 due to the mixture of foreign matter, if any, is easily detected. In other words, the time taken to complete the determination of whether or not foreign matter is mixed can be shortened.

Figure 11:
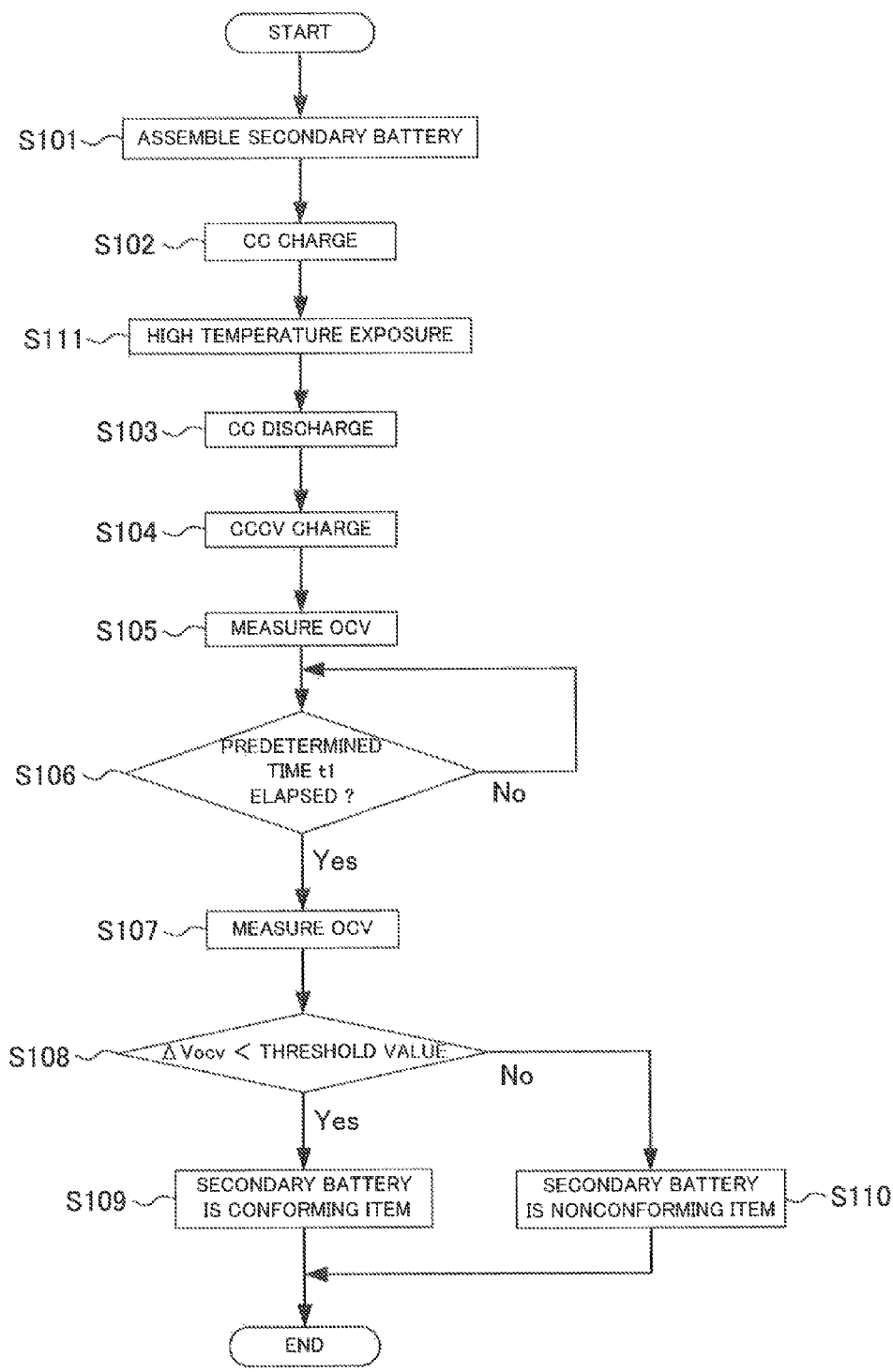
FIG. 11 is a flow chart showing a test process in a modification of Embodiment 1.

A modification of the present embodiment is described. FIG. 11 is a flow chart showing the process of testing the secondary battery 1 in the present modification. The processing steps identical to the processing steps described in the present embodiment are designated with the same reference numerals, and detailed description thereof is omitted.

Figure 12:
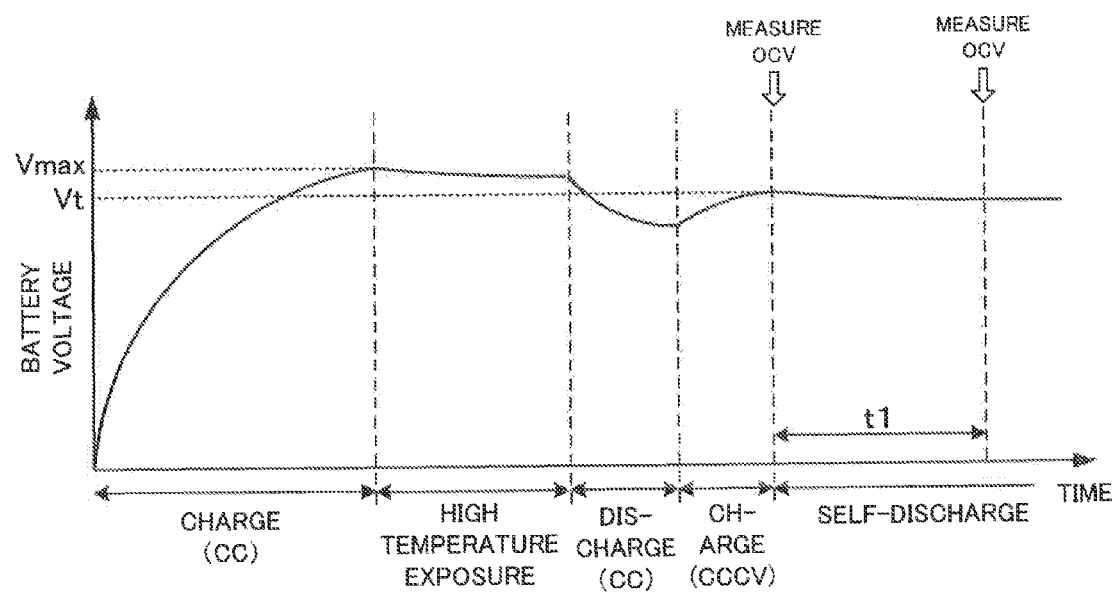
FIG. 12 is a graph showing changes in voltage of the secondary battery during the test in the modification of Embodiment 1.

In the present modification, after the charge in the CC mode is performed at step S102, the secondary battery 1 is left standing under a high-temperature environment at step S111. FIG. 12 is a graph showing changes in voltage of the secondary battery 1 during the test process in the present modification, and corresponds to FIG. 6.

At step S111, the secondary battery 1 is heated by using a heat source. The heat source is only required to generate heat and can be selected as appropriate. When the secondary battery 1 is heated, the ion diffusion speed can be increased in the negative electrode active material layer 202b.

Figure 13:
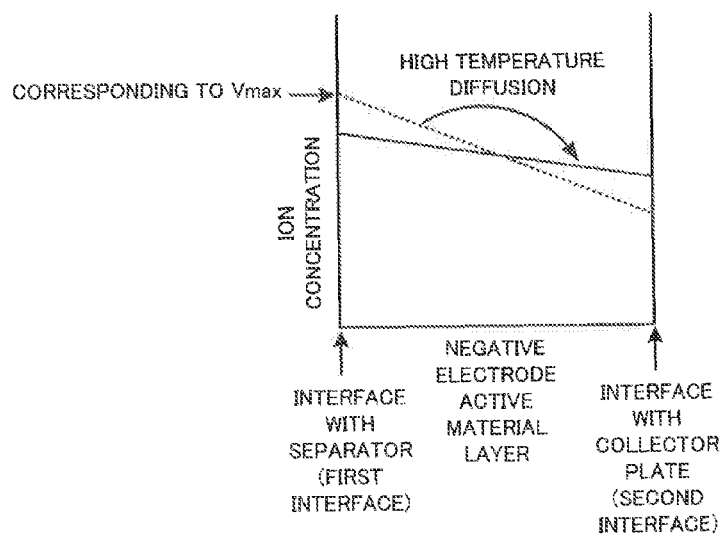
FIG. 13 is a diagram for explaining changes in distribution of ion concentration caused by heating the secondary battery in the modification of Embodiment 1.

FIG. 13 shows the distributions of ion concentration within the negative electrode active material layer 202b. In FIG. 13, a dotted line represents the ion concentration distribution after the processing at step S102 (charge in the CC mode) is performed. A solid line represents the ion concentration distribution after the secondary battery 1 is heated. As shown in FIG. 13, the secondary battery 1 is heated to increase the ion diffusion speed, which can reduce the slope of the ion concentration distribution. In other words, the nonuniformity of the ion concentration can be reduced.

The temperature to which the secondary battery 1 is heated can be determined in view of the ion diffusion speed. Excessive heat applied to the secondary battery 1 may deteriorate the secondary battery 1, and this possibility can be considered to determine the temperature to which the secondary battery 1 is heated.

The time for which the secondary battery 1 is heated can be set as appropriate. As the time for which the secondary battery 1 is heated is extended, the time taken to complete the test process for the secondary battery 1 is extended. The heating of the secondary battery 1 is not required in the state in which the nonuniformity of the ion concentration is reduced. These facts can be considered to determine the time for which the secondary battery 1 is heated.

Although the secondary battery 1 is heated after step S102 in the present modification, the present invention is not limited thereto. Since the heating of the secondary battery 1 can increase the ion diffusion speed to reduce the nonuniformity of the ion concentration, the point in time at which the secondary battery 1 is heated can be set as appropriate. For example, the secondary battery 1 can be heated after the processing at step S103 (discharge in the CC mode) is performed or after the processing at step S104 (charge in the CCCV mode) is performed.

Alternatively, the secondary battery 1 can be heated after at least two of the processing operations at step S102, S103, and S104 are performed. In this case, the processing of heating the secondary battery 1 is performed a plurality of times. Although the discharge in the CC mode is performed at step S103 in the present embodiment, discharge in the CCCV mode may be performed instead of the discharge in the CC mode.

In the present embodiment, the processing operations at step S102 and S103 may be repeatedly performed. Specifically, after the processing at step S103 is performed, the processing can continue in the order of steps S102 and S103. After the processing operations at steps S102 and S103 are repeated, the processing at step S104 can be performed. The repeated charge and discharge can suppress the nonuniformity of the ion concentration closer to the first interface. The number of times the processing operations at step S102 and S103 are repeated can be set as appropriate.

Embodiment 2

Description is made of a process of testing a secondary battery 1 which is Embodiment 2 of the present invention.

The processing operations and members described in Embodiment 1 are designated with the same reference numerals, and detailed description thereof is omitted.

Figure 14:
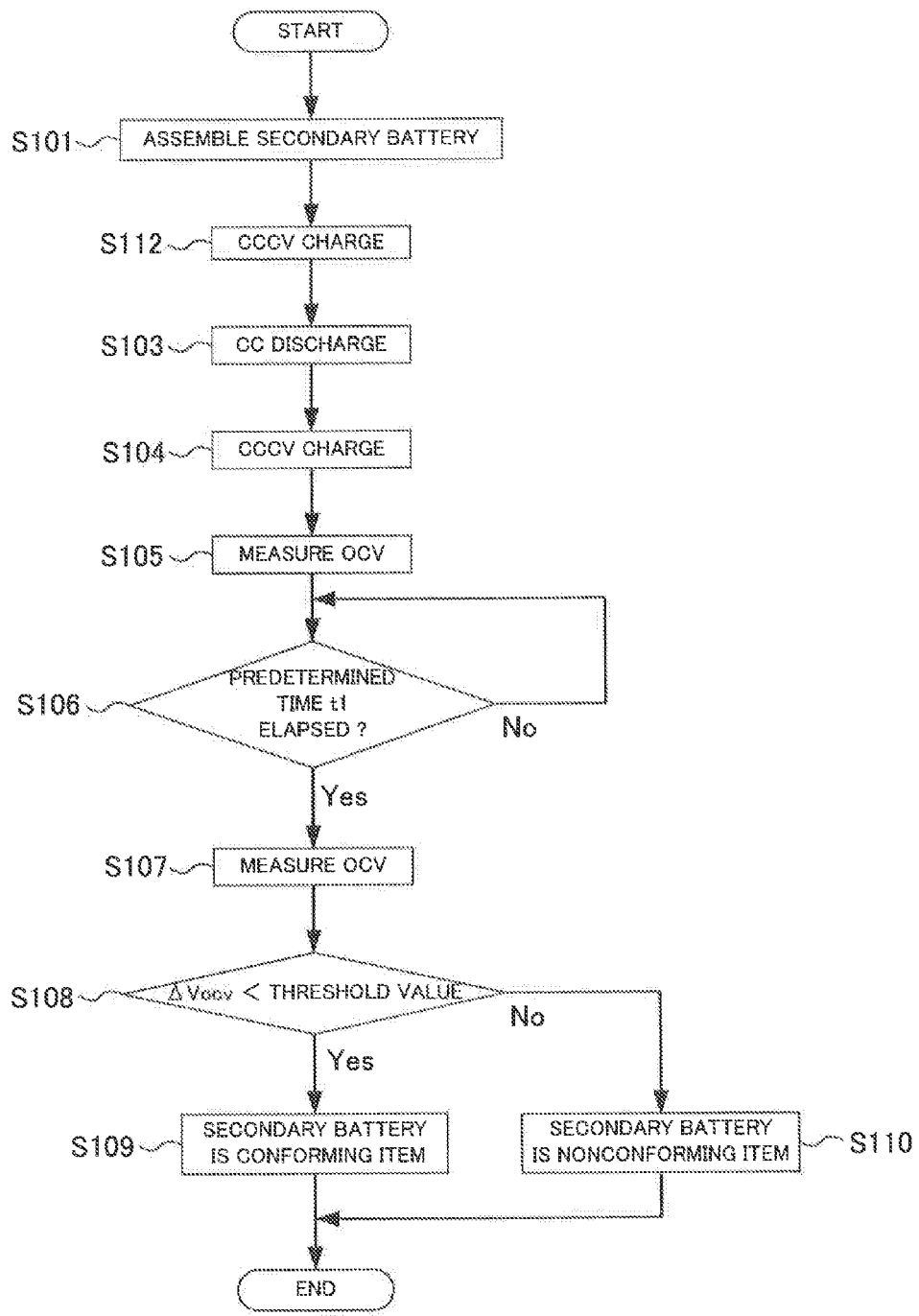
FIG. 14 is a flow chart showing a test process in Embodiment 2.
Figure 15:
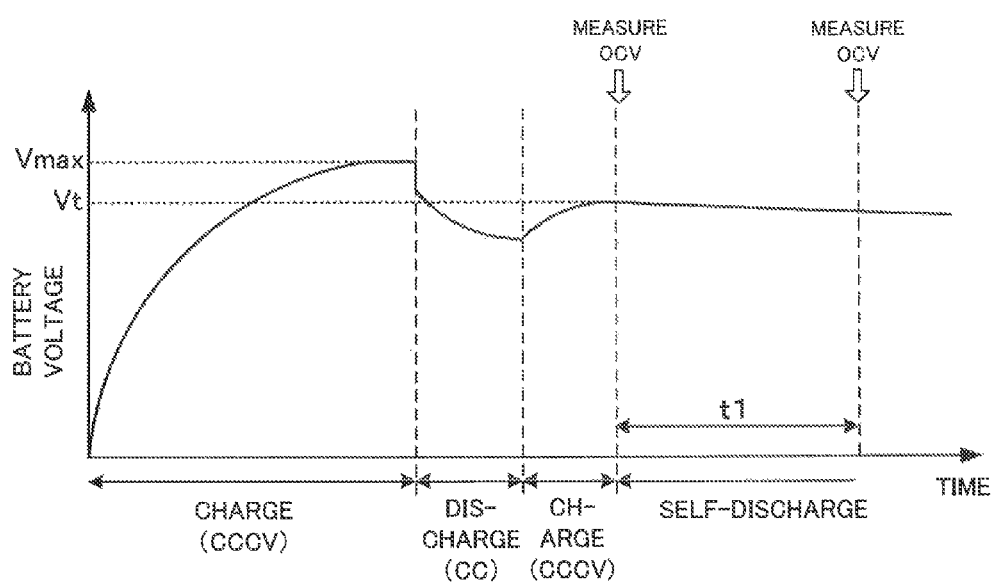
FIG. 15 is a graph showing changes in voltage of a secondary battery during the test in Embodiment 2.

FIG. 14 is a flow chart showing the test process in the present embodiment. In Embodiment 1, the secondary battery 1 is assembled and then the charge in the CC mode is performed. In the present embodiment, however, the secondary battery 1 is assembled and then charge in the CCCV mode is performed at step S112. FIG. 15 is a graph showing changes in voltage of the secondary battery 1 when the test in the present embodiment is performed.

When the charge in the CCCV mode is performed, the voltage of the secondary battery 1 is increased to reach an upper limit voltage Vmax as shown in FIG. 15. After the voltage of the secondary battery 1 reaches the upper limit voltage Vmax, the voltage of the secondary battery 1 is maintained at the upper limit voltage Vmax.

Figure 16:
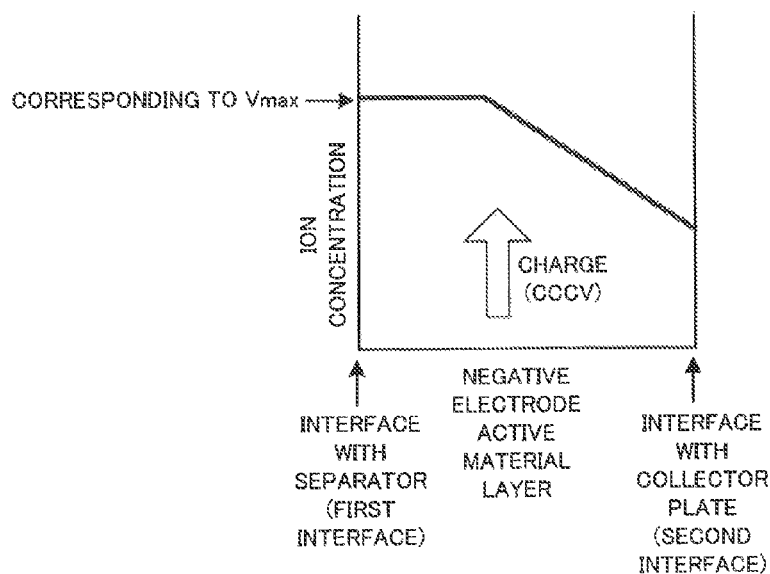
FIG. 16 is a diagram showing the distribution of ion concentration in a negative electrode active material layer after charge in a CCCV mode is performed in Embodiment 2.

On the other hand, a negative electrode active material layer 202b has a distribution of ion concentration as shown in FIG. 16 when the charge in the CCCV mode is performed. In FIG. 16, the ion concentration is uniform in a region including a first interface. The ion concentration at the first interface corresponds to the upper limit voltage Vmax. The ion concentration is reduced toward a second interface.

Figure 17:
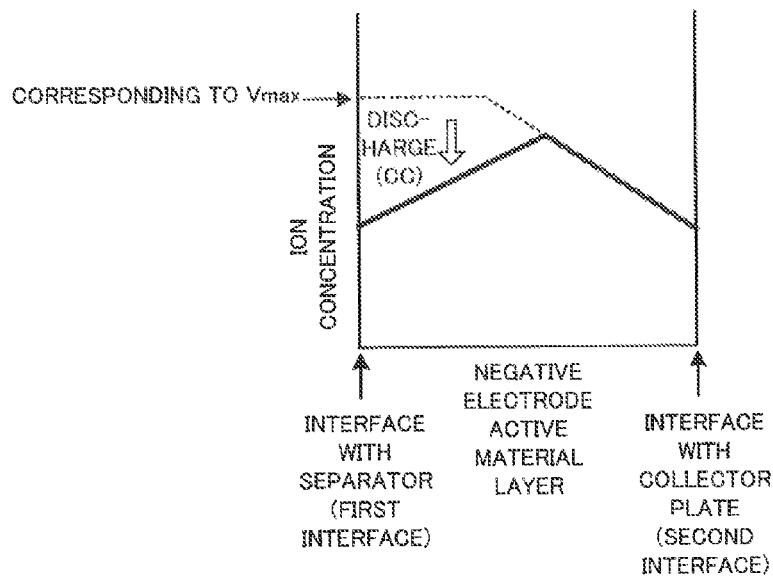
FIG. 17 is a diagram showing the distribution of ion concentration in the negative electrode active material layer after discharge in a CC mode is performed in Embodiment 2.

When discharge in the CC mode is performed at step S103, the ion concentration starts to reduce at the first interface as shown in FIG. 17. In the ion concentration distribution within the negative electrode active material layer 202b, the highest ion concentration is found at a portion between the first interface and the second interface.

Figure 18:
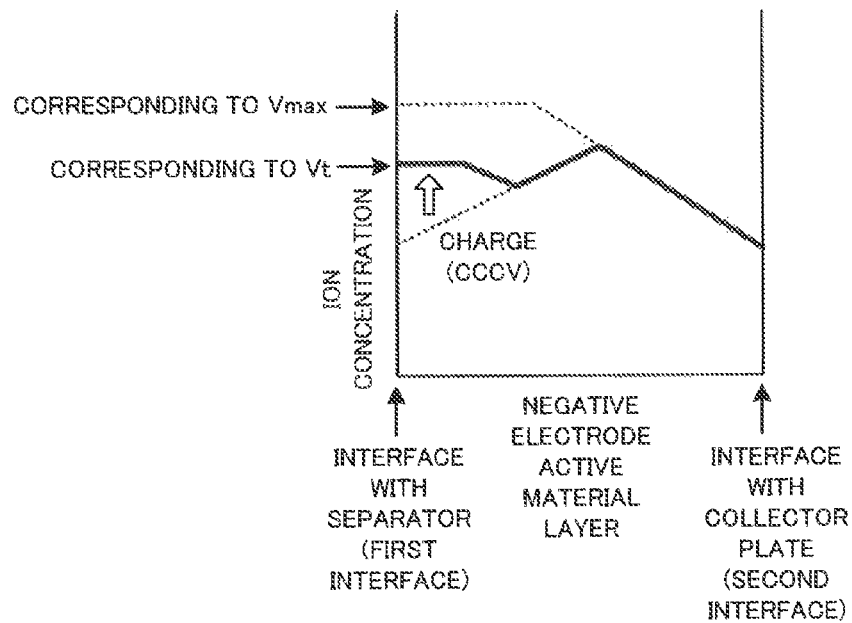
FIG. 18 is a diagram showing the distribution of ion concentration in the negative electrode active material layer after charge in the CCCV mode is performed in Embodiment 2.

When charge in the CCCV mode is performed at step S104, the ion concentration starts to increase at the first interface as shown in FIG. 18. The ion concentration at the first interface corresponds to a target value Vt. Since the charge is performed at a constant voltage, the ion concentration is uniformized in a region including the first interface.

Figure 19:
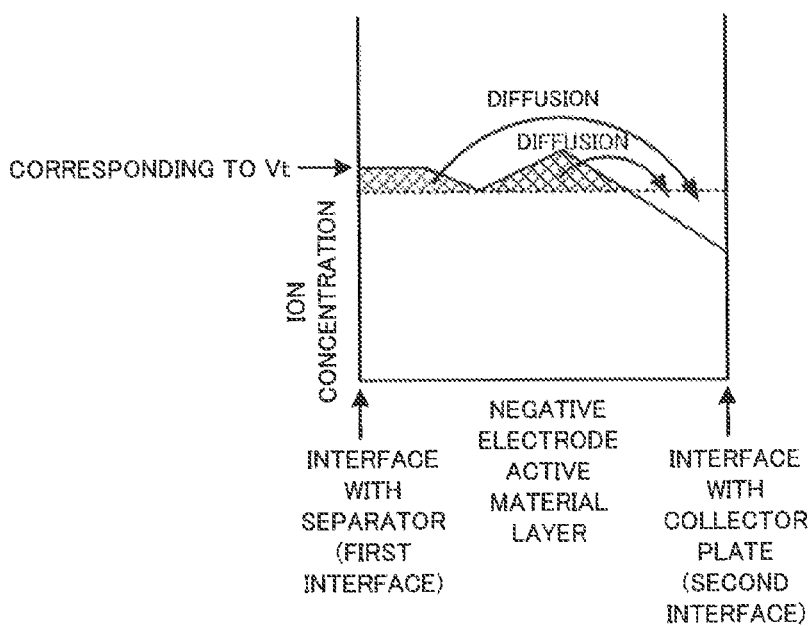
FIG. 19 is a diagram for explaining ion diffusion when the secondary battery is left standing in Embodiment 2.
Figure 20:
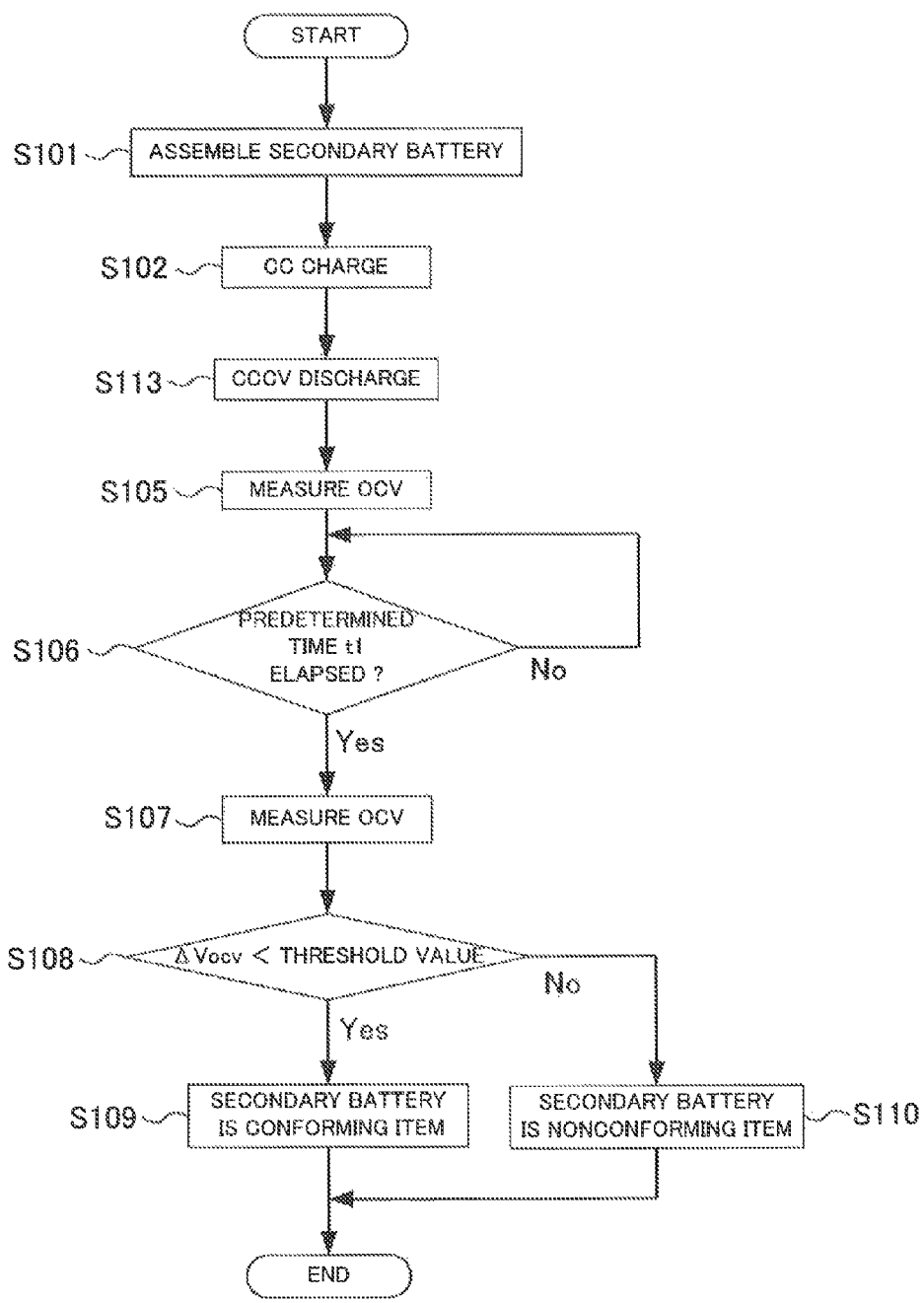
FIG. 20 is a flow chart showing a test process in Embodiment 3.

In the present embodiment, the processing operations from step S112 to step S104 can be performed to achieve the ion concentration distribution in the negative electrode active material layer 202b as shown in FIG. 19. Specifically, the nonuniformity of the ion concentration can be reduced as compared with the ion concentration distribution shown in FIG. 16. Once the nonuniformity of the ion concentration is reduced, the ions can be diffused in a shorter time period to uniformize the ion concentration. If the secondary battery 1 is short-circuited due to foreign matter, the voltage drop caused by the short circuit is easily detected. In other words, the time taken to complete the test of the secondary battery 1 can be shortened.

As a modification of the present embodiment, the processing of heating the secondary battery 1 with a heat source can be added similarly to Embodiment 1. The processing of heating the secondary battery 1 can be performed after at least one of the processing operations at step S112, S103, and S104 is performed. The heating of the secondary battery 1 can increase the ion diffusion speed to easily uniformize the ion concentration in the negative electrode active material layer 202b.

Although the discharge in the CC mode is performed at step S103 in the present embodiment, discharge in the CCCV mode may be performed instead of the discharge in the CC mode.

In the present embodiment, the processing operations at step S112 and S103 may be repeatedly performed. Specifically, after the processing at step S103 is performed, the processing can continue in the order of steps S112 and S103. After the processing operations at steps S112 and S103 are repeated, the processing at step S104 can be performed. The repeated charge and discharge can suppress the nonuniformity of the ion concentration closer to the first interface. The number of times the processing operations at step S112 and S103 are repeated can be set as appropriate.

Embodiment 3

Description is made of a process of testing a secondary battery 1 which is Embodiment 3 of the present invention. The processing operations and members described in Embodiment 1 are designated with the same reference numerals, and detailed description thereof is omitted.

Figure 21:
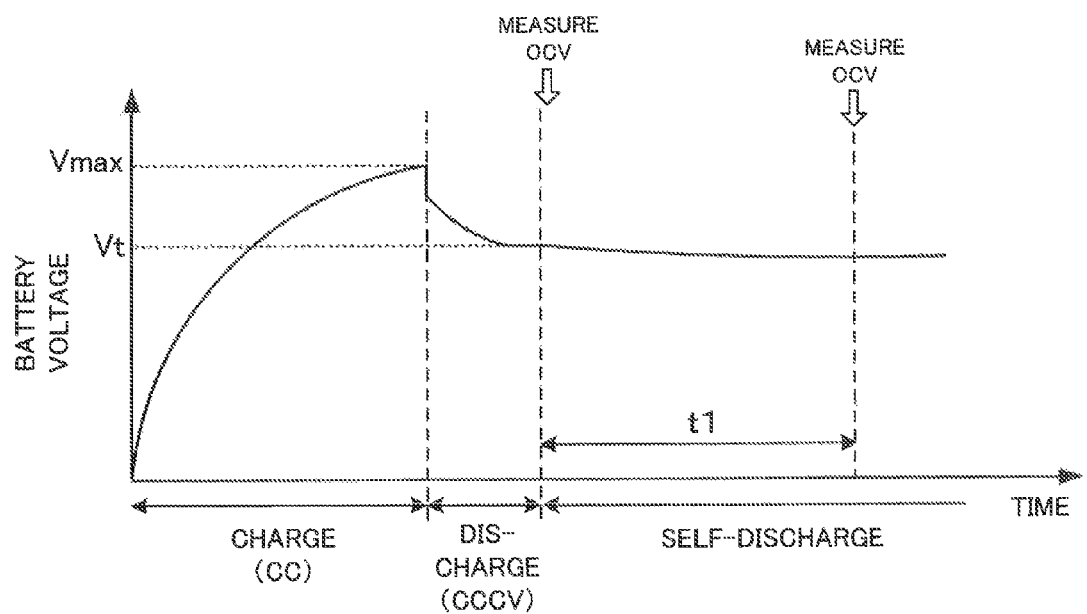
FIG. 21 is a graph showing changes in voltage of a secondary battery during the test in Embodiment 3.

In the present embodiment, after processing at step S102 (charge in the CC mode) is performed, discharge in the CCCV mode is performed at step S113. FIG. 21 shows changes in voltage of the secondary battery 1 when the test in the present embodiment is performed. The discharge in the CCCV mode causes the voltage of the secondary battery 1 to be reduced from the upper limit voltage Vmax and to reach the target voltage Vt. When the voltage of the secondary battery 1 reaches the target voltage Vt, discharge is performed at a constant voltage to maintain the voltage of the secondary battery 1 at the target voltage Vt.

Figure 22:
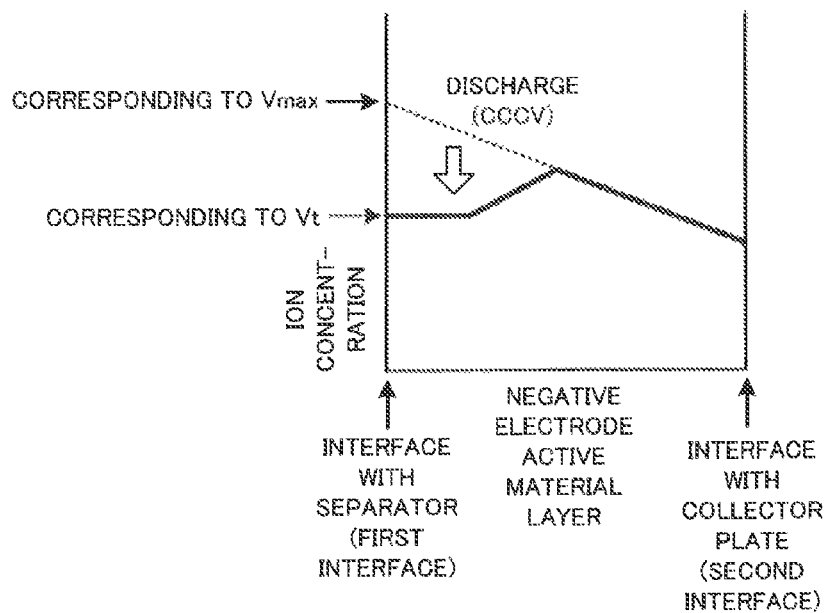
FIG. 22 is a diagram showing the distribution of ion concentration in a negative electrode active material layer after discharge in a CCCV mode is performed in Embodiment 3.

When the processing at step S113 is performed, the ion concentration at the first interface is reduced as shown in FIG. 22. Since the discharge is performed at the constant voltage, the ion concentration is uniformized in a region including the first interface. After the processing at step S113 is completed, the OVC of the secondary battery 1 is measured at step S105.

Figure 23:
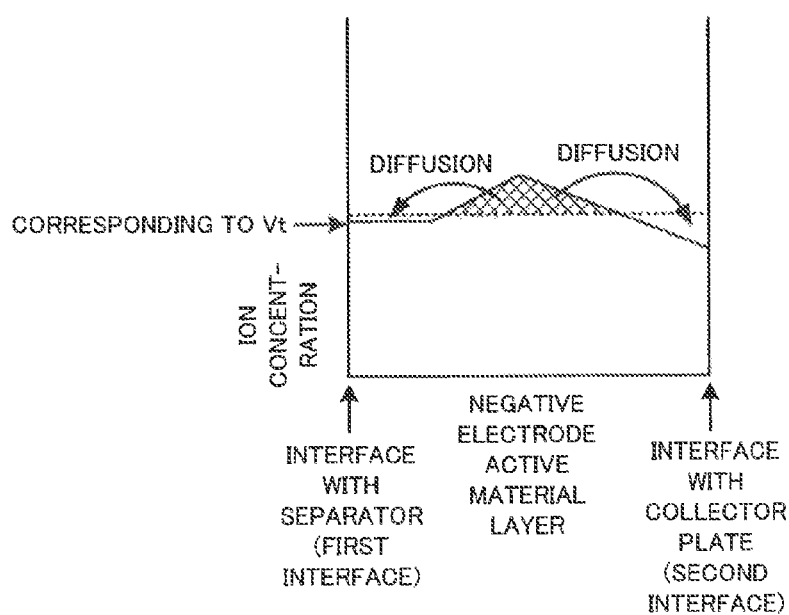
FIG. 23 is a diagram for explaining ion diffusion when the secondary battery is left standing in Embodiment 3.

In the present embodiment, a negative electrode active material layer 202b can have a distribution of ion concentration as shown in FIG. 23 before the secondary battery 1 is left standing. In other words, the nonuniformity of the ion concentration can be reduced. This can facilitate the ion diffusion to shorten the time taken by the voltage change resulting from the ion diffusion. By uniformizing the ion concentration at an early stage, the voltage change resulting from the short circuit of the secondary battery 1 due to foreign matter, if any, is easily detected.

As a modification of the present embodiment, the processing of heating the secondary battery 1 with the heat source can be added similarly to Embodiment 1. The processing of heating the secondary battery 1 can be performed after at least one of the processing operations at step S102 and S113 is performed. The heating of the secondary battery 1 can increase the ion diffusion speed to easily uniformize the ion concentration in the negative electrode active material layer 202b.

Although the charge in the CC mode is performed at step S102 in the present embodiment, charge in the CCCV mode may be performed instead of the charge in the CC mode. In performing the charge in the CCCV mode, the charge is performed at a constant current to cause the voltage of the secondary battery 1 to reach the upper limit voltage Vmax, and then the charge is performed at a constant voltage to maintain the voltage of the secondary battery 1 at the upper limit voltage Vmax. The processing of heating the secondary battery 1 can also be added when the charge in the CCCV mode is performed.

In the present embodiment, the processing operations at step S102 and S113 may be repeatedly performed. Specifically, after the processing at step S113 is performed, the processing can continue in the order of steps S102 and S113. After the processing operations at steps S102 and S113 are repeated, the processing at step S105 can be performed. The repeated charge and discharge can suppress the nonuniformity of the ion concentration closer to the first interface. The number of times the processing operations at step S102 and S113 are repeated can be set as appropriate.

The invention claimed is:

1. A method of testing a secondary battery comprising:
   a first step of charging the secondary battery after manufacture to a first voltage in a constant-current mode;
   a second step of setting a second voltage lower than the first voltage as a target voltage and performing discharge or charge in a constant-current constant-voltage mode, the second step being performed before the secondary battery is left standing;
   a third step of measuring a first open circuit voltage of the secondary battery when starting to leave the secondary battery standing and a second open circuit voltage of the secondary battery when a predetermined time is elapsed after starting to leave the secondary battery standing; and
   a fourth step of determining whether the secondary battery is a conforming item or not based on a difference between the first open circuit voltage and the second open circuit voltage.

2. The method of testing the secondary battery according to claim 1, wherein, after charging the secondary battery, the secondary battery is discharged in the constant-current constant-voltage mode at the second step.

3. The method of testing the secondary battery according to claim 1, wherein, after discharging the secondary battery, the secondary battery is charged in the constant-current constant-voltage mode at the second step.

4. The method of testing the secondary battery according to claim 1, wherein, at the fourth step, the secondary battery is determined as a nonconforming item when the difference between the first and second open circuit voltages is larger than a threshold value, and the secondary battery is determined as a conforming item when the difference between the first and second open circuit voltages is smaller than the threshold value.

5. The method of testing the secondary battery according to claim 1, wherein the first voltage is an upper limit voltage of the secondary battery.

6. The method of testing the secondary battery according to claim 1, wherein, at the fourth step, it is determined that foreign matter is mixed in the secondary battery when the difference between the first and second open circuit voltages is larger than a threshold value, and it is determined that no foreign matter is mixed in the secondary battery when the difference between the first and second open circuit voltages is smaller than the threshold value.

7. A method of testing a secondary battery comprising:
   a first step of charging the secondary battery after manufacture to a first voltage;
   a second step of setting a second voltage lower than the first voltage as a target voltage and performing discharge or charge in a constant-current constant-voltage mode, the second step being performed before the secondary battery is left standing;
   a third step of measuring a first open circuit voltage of the secondary battery when starting to leave the secondary battery standing and a second open circuit voltage of the secondary battery when a predetermined time is elapsed after starting to leave the secondary battery standing;
   a fourth step of determining whether the secondary battery is a conforming item or not based on a difference between the first open circuit voltage and the second open circuit voltage; and
   a heating step of supplying heat generated in a heat source to the secondary battery.

8. The method of testing the secondary battery according to claim 7, wherein the heating step is performed after the first step.

9. The method of testing the secondary battery according to claim 7, wherein the heating step is performed before the secondary battery is left standing.

10. The method of testing the secondary battery according to claim 7, wherein the charge is performed in a constant-current constant-voltage mode at the first step.

11. The method of testing the secondary battery according to claim 7, wherein, after charging the secondary battery, the secondary battery is discharged in the constant-current constant-voltage mode at the second step.

12. The method of testing the secondary battery according to claim 7, wherein, after discharging the secondary battery, the secondary battery is charged in the constant-current constant-voltage mode at the second step.

13. The method of testing the secondary battery according to claim 7, wherein, at the fourth step, the secondary battery is determined as a nonconforming item when the difference between the first and second open circuit voltages is larger than a threshold value, and the secondary battery is determined as a conforming item when the difference between the first and second open circuit voltages is smaller than the threshold value.

14. The method of testing the secondary battery according to claim 7, wherein the first voltage is an upper limit voltage of the secondary battery.

15. The method of testing the secondary battery according to claim 7, wherein, at the fourth step, it is determined that the foreign matter is mixed in the secondary battery when the difference between the first and second open circuit voltages is larger than a threshold value, and it is determined that no foreign matter is mixed in the secondary battery when the difference between the first and second open circuit voltages is smaller than the threshold value.

* * * * *